United States Patent
Huang et al.

(10) Patent No.: US 10,511,284 B2
(45) Date of Patent: Dec. 17, 2019

(54) RESONATOR AND RELATED MANUFACTURING METHOD

(71) Applicants: Semiconductor Manufacturing International (Shanghai) Corporation, Shanghai (CN); NINGBO SEMICONDUCTOR INTERNATIONAL CORPORATION, Ningbo (CN)

(72) Inventors: Herb He Huang, Shanghai (CN); Clifford Ian Drowley, Shanghai (CN); Jiguang Zhu, Shanghai (CN); Haiting Li, Shanghai (CN)

(73) Assignees: Semiconductor Manufacturing International (Shanghai) Corporation, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 439 days.

(21) Appl. No.: 15/371,968

(22) Filed: Dec. 7, 2016

(65) Prior Publication Data
US 2017/0170806 A1    Jun. 15, 2017

(30) Foreign Application Priority Data
Dec. 14, 2015    (CN) .......................... 2015 1 0929103

(51) Int. Cl.
*H03H 9/17*    (2006.01)
*H03H 9/10*    (2006.01)
*H03H 3/02*    (2006.01)

(52) U.S. Cl.
CPC .............. *H03H 9/17* (2013.01); *H03H 3/02* (2013.01); *H03H 9/1007* (2013.01); *H03H 9/173* (2013.01)

(58) Field of Classification Search
CPC ......... H03H 9/17; H03H 9/173; H03H 9/1007
See application file for complete search history.

(56) References Cited

U.S. PATENT DOCUMENTS

| | | | |
|---|---|---|---|
| 2002/0121337 A1 | 9/2002 | Whatmore et al. | |
| 2005/0218755 A1 | 10/2005 | Song et al. | |
| 2005/0253670 A1 | 11/2005 | Song et al. | |
| 2009/0001856 A1* | 1/2009 | Hara | H03H 9/0595 310/348 |
| 2012/0075030 A1* | 3/2012 | Iwasaki | H03H 9/1057 331/156 |

FOREIGN PATENT DOCUMENTS

CN    101335507 A    12/2008
WO    2011114628 A1    9/2011

* cited by examiner

*Primary Examiner* — J. San Martin
(74) *Attorney, Agent, or Firm* — Anova Law Group, PLLC

(57) ABSTRACT

A resonator may include a first dielectric member, a second dielectric member, a composite member, a first sealer, and a second sealer. The first dielectric member may have a first cavity. The second dielectric member may have a second cavity. The composite member may include a piezoelectric layer and may be positioned between the first cavity and the second cavity. The first sealer may be positioned between two portions of the first dielectric member. The first cavity may be positioned between the first sealer and the composite member. The second sealer may be positioned between two portions of the second dielectric member. The second cavity may be positioned between the second sealer and the composite member.

20 Claims, 6 Drawing Sheets

RESONATOR AND RELATED MANUFACTURING METHOD

CROSS-REFERENCE TO RELATED APPLICATION

This application claims priority to and benefit of Chinese Patent Application No. 201510929103.0, filed on 14 Dec. 2015; the Chinese Patent Application is incorporated herein by reference in its entirety.

BACKGROUND

The technical field is related to a resonator and a method for manufacturing the resonator.

A resonator, such as a film bulk acoustic resonator (FBAR), may be used for radio frequency (RF) filtering or pressure sensing. A resonator may include a piezoelectric film. The piezoelectric film may have a through hole that is resulted from the manufacturing process of the resonator. The through hole may negatively affect the performance of the resonator.

SUMMARY

An embodiment may be related to a resonator. The resonator may include a first dielectric member, a second dielectric member, a composite member, a first sealer, and a second sealer. The first dielectric member may have a first cavity. The second dielectric member may have a second cavity. The composite member may include a piezoelectric layer and may be positioned between the first cavity and the second cavity. The first sealer may be positioned between two portions of the first dielectric member. The first cavity may be positioned between the first sealer and the composite member. The second sealer may be positioned between two portions of the second dielectric member. The second cavity may be positioned between the second sealer and the composite member.

A section of the composite member may extend from a first wall of the first cavity to a second wall of the first cavity and may have no through holes.

The first cavity may expose a side of the first sealer. The second cavity may expose a side of the second sealer.

The first dielectric member may include a first dielectric layer and a second dielectric layer. The second dielectric layer may be positioned between the first dielectric layer and the composite member. A height of the first cavity (e.g., a maximum height of the first cavity in a direction perpendicular to the piezoelectric layer) may be equal to a thickness of the second dielectric layer. A material of the first dielectric layer may be different from or identical to a material of the second dielectric layer. The first sealer may be positioned between two portions of the first dielectric layer. A length of the first sealer may be greater than or equal to a thickness of the first dielectric layer. The length of the first sealer may be greater than the thickness of the first dielectric layer, and the first sealer may extend into the first cavity.

The composite member may include a first electrical conductor, which may be positioned between the first cavity and the piezoelectric layer. A section of the first electrical conductor may extend from a first wall of the first cavity to a second wall of the first cavity and may have no through holes. The first electrical conductor may be formed of a semiconductor material or a metal material. The composite member may include a first electrical insulator. The first electrical conductor may be positioned between the first cavity and the first electrical insulator. The composite member may include a second electrical conductor, which may be positioned between the second cavity and the piezoelectric layer. A section of the second electrical conductor may continuously extend from a first wall of the second cavity to a second wall of the second cavity without having any through holes.

A first side of the composite member may overlap, may directly contact, and may be parallel to a side of the first dielectric member. A first sidewall of the first cavity and a second sidewall of the first cavity may be directly connected to the first side of the composite member. A second side of the composite member may overlap, may directly contact, and may be parallel to a side of the second dielectric member. A first sidewall of the second cavity and a second sidewall of the second cavity may be directly connected to the second side of the composite member.

An embodiment may be related to a method for manufacturing a resonator. The method may include the following steps: providing a first dielectric member, which may have a first cavity; providing a second dielectric member, which may have a second cavity; providing a composite member, which may include a piezoelectric layer and may be positioned between the first cavity and the second cavity; providing a first sealer, which may be positioned between two portions of the first dielectric member. The first cavity may be positioned between the first sealer and the composite member; and providing a second sealer, which may be positioned between two portions of the second dielectric member. The second cavity may be positioned between the second sealer and the composite member.

The method may include the following steps: providing a first dielectric layer; providing a second dielectric layer and a first sacrificial layer on the first dielectric layer; providing the composite member on the first sacrificial layer and the second dielectric layer; forming a first through hole set in the first dielectric layer; removing the first sacrificial layer through the first through hole set to form the first cavity; and providing a first sealer set in the first through hole set to seal the first through hole set. The first dielectric member may include remaining portions of the first dielectric layer and the second dielectric layer.

The method may include the following steps: providing a second sacrificial layer on the composite member; providing a third dielectric layer on the second sacrificial layer and the composite member; forming a second through hole set in the third dielectric layer; removing the second sacrificial layer through the second through hole set to form the second cavity; and providing a second sealer set in the second through hole set to seal the second through hole set.

The first sacrificial layer may be removed after the second sacrificial layer may have been removed.

The method may include reorienting (e.g., inverting) a structure that has the second cavity before forming the first through hole set.

The method may include reorienting (e.g., inverting) a structure that has the second cavity before forming the first cavity.

The composite member may include a first electrical conductor, which may be positioned between the first cavity and the piezoelectric layer. A section of the first electrical conductor may extend from a first wall of the first cavity to a second wall of the first cavity and may have no through holes. The first cavity may be aligned with the second cavity in a direction perpendicular to a side of the first electrical conductor that is exposed by the first cavity.

An embodiment may be related to an electronic device. The electronic device may include an electronic component and a resonator electrically connected to the electronic component. The resonator may have one or more of the above-described features.

According to embodiments, a resonator may include a continuous composite member that includes a piezoelectric film. The composite member may substantially (and/or completely) separate two cavities of the resonator and may substantially (and/or completely) seal the two cavities of the resonator. Advantageously, satisfactory performance of the resonator may be attained.

The above summary is related to some of many embodiments disclosed herein and is not intended to limit the scope of embodiments.

DETAILED DESCRIPTION

Figure 1:
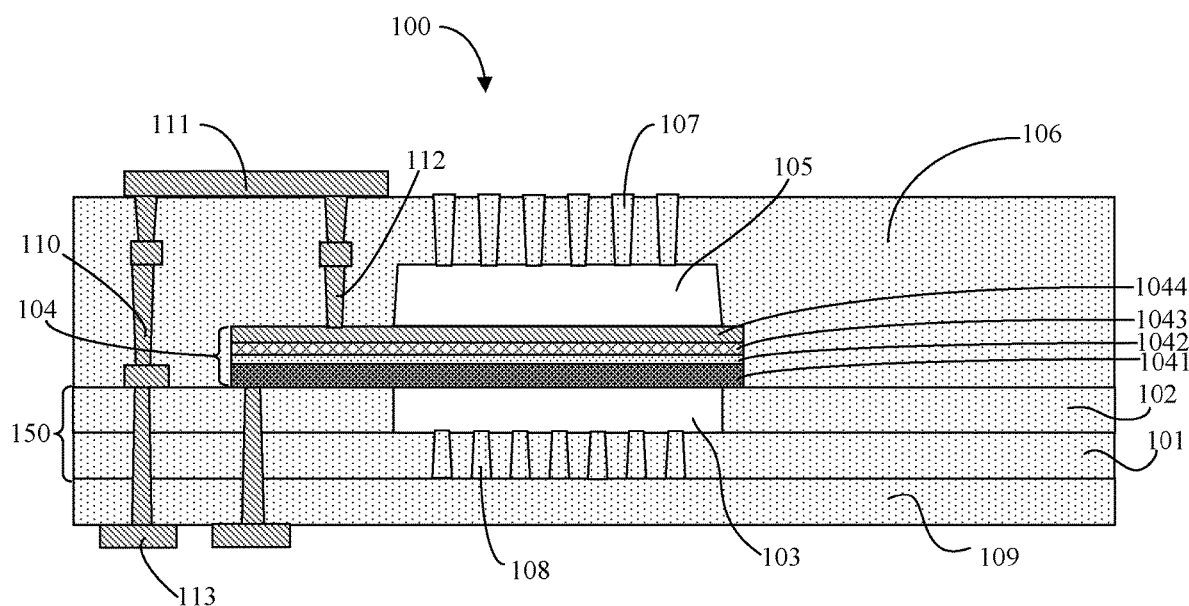
FIG. 1 shows a schematic diagram (e.g., a schematic cross-sectional view) that illustrates elements and/or structures in a resonator in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a schematic diagram (e.g., a schematic cross-sectional view) that illustrates elements and/or structures in a resonator 100 in accordance with one or more embodiments. The resonator 100 may include a dielectric member 150, a dielectric member 106, a composite member 104, a set of sealers that includes a sealer 108, and a set of sealers that includes a sealer 107. The dielectric member 150 may have a cavity 103. The dielectric member 106 may have a cavity 105. The composite member 104 may include a piezoelectric layer 1043 and may be positioned between the cavity 103 and the cavity 105. The cavity 103 may be substantially aligned with the cavity 105 in a direction perpendicular to a side (e.g., bottom side or top side) of the composite member 104. Edges of the cavity 103 may be substantially aligned with edges of the cavity 105 in the direction perpendicular to the side (e.g., bottom side or top side) of the composite member 104. The sealer 108 may be positioned between two portions of the dielectric member 150 (and may be surrounded by the dielectric member 150). The cavity 103 may be positioned between the sealer 108 and the composite member 104. The cavity 103 may expose a side (e.g., top side) of the sealer 108 and may expose a portion of a first side (e.g., bottom side) of the composite member 104. The sealer 107 may be positioned between two portions of the dielectric member 106 (and may be surrounded by the dielectric member 106). The cavity 105 may be positioned between the sealer 107 and the composite member 104. The cavity 105 may expose a side (e.g., bottom side) of the sealer 107 and may expose a portion of a second side (e.g., top side) of the composite member 104.

A first side (e.g., bottom side) of the composite member 104 may overlap, may directly contact, and may be parallel to a side (e.g., top side) of the dielectric member 150. A first sidewall (e.g., left sidewall) of the cavity 103 and a second sidewall (e.g., right sidewall) of the cavity 103 may be directly connected to the first side of the composite member 104. A second side (e.g., top side) of the composite member 104 may overlap, may directly contact, and may be parallel to a side of the dielectric member 106. A first sidewall (e.g., left sidewall) of the cavity 105 and a second sidewall (e.g., right sidewall) of the cavity 105 may be directly connected to the second side of the composite member 104. A section of the composite member 104 may extend from the first sidewall (e.g., left sidewall) of the cavity 103 to the second sidewall (e.g., right sidewall) of the cavity 103 and may have no through holes or interruptions. A section of the composite member 104 may extend from the first sidewall (e.g., left sidewall) of the cavity 105 to the second sidewall (e.g., right sidewall) of the cavity 105 and may have no through holes or interruptions. Therefore, the composite member 104 may substantially (and/or completely) separate the cavities 103 and 105 from each other and may substantially (and/or completely) sear each of the cavities 103 and 105. Advantageously, satisfactory performance of the resonator 100 may be attained.

The piezoelectric layer 1043 may be formed of at least one piezoelectric material, such as at least one of ZnO, AlN, and GaN. The piezoelectric layer 1043 may be formed of material that has a wurtzite crystal structure. The piezoelectric layer 1043 may be formed of AlN. A thickness of the piezoelectric film 1043 may be configured according to a target resonance frequency associated with the resonator 100. The thickness of the piezoelectric film 1043 may be about ½ of the wavelength associated with the target resonance frequency.

The composite member 104 may include an electrical conductor 1041. The electrical conductor 1041 may be positioned between the cavity 103 and the piezoelectric layer 1043. A section of the electrical conductor 1041 may extend from the first sidewall of the cavity 103 to the second sidewall of the cavity 103 and may have no through holes. The electrical conductor 1041 may be formed of at least one semiconductor material and/or at least one metal material. The electrical conductor 1041 may be formed of one or more of Si, Ge, SiGe, SiC, SiGeC, etc. The electrical conductor 1041 may be or may include a monocrystalline silicon (or single-crystal silicon) film. The electrical conductor 1041 may be or may include one or more films formed of at least one of platinum (Pt), gold (Au), iridium (Ir), osmium (Os), rhenium (Re), palladium (Pd), rhodium (Rh), ruthenium (Ru), molybdenum (Mo), tungsten (W), etc. A thickness of the electrical conductor 1041 may be configured according to a target resonance frequency associated with the resonator 100. The thickness of the electrical conductor 1041 may be about 1/10 of the wavelength associated with the target resonance frequency.

The composite member 104 may include an electrical insulator 1042. The electrical insulator 1042 may be positioned between the electrical conductor 1041 and the piezoelectric layer 1043 (and may directly contact at least one of the electrical conductor 1041 and the piezoelectric layer 1043). A bottom area and/or a top area of the electrical insulator 1042 may be equal to a bottom area and/or a top area of the electrical conductor 1041 and/or a bottom area and/or a top area of the piezoelectric layer 1043. The electrical conductor 1041 may be positioned between the cavity 103 and the electrical insulator 1042. The electrical insulator 1042 may be formed of one or more inorganic materials. The electrical insulator 1042 may be or may include at least one of a silicon oxide layer, a silicon nitride layer, and a silicon oxynitride layer. The electrical insulator 1042 may be or may include a silicon oxide layer.

The composite member 104 may include an adhesive layer (or glue layer) positioned between the electrical conductor 1041 and the electrical insulator 1042 for reinforcing bonding between the electrical conductor 1041 and the electrical insulator 1042. The adhesive layer may be formed of a material that has a wurtzite crystal structure. The adhesive layer may be formed of molybdenum (Mo).

The composite member 104 may include an electrical conductor 1044. The electrical conductor 1044 may be positioned between the cavity 105 and the piezoelectric layer 1043. A section of the electrical conductor 1044 may continuously extend from the first sidewall of the cavity 105 to the second sidewall of the cavity 105 without having any through holes. The cavity 103 may be aligned with the cavity 105 in a direction perpendicular to a side (e.g., bottom side) of the electrical conductor 1041 that is exposed by the cavity 103.

The electrical conductor 1044 may be formed of at least one semiconductor material and/or at least one metal material. The electrical conductor 1044 may be formed of one or more of Si, Ge, SiGe, SiC, SiGeC, etc. The electrical conductor 1044 may be or may include a monocrystalline silicon (or single-crystal silicon) film. The electrical conductor 1044 may be or may include one or more films formed of at least one of platinum (Pt), gold (Au), iridium (Ir), osmium (Os), rhenium (Re), palladium (Pd), rhodium (Rh), ruthenium (Ru), molybdenum (Mo), tungsten (W), etc.

A thickness of the electrical conductor 1044 may be configured according to a target resonance frequency associated with the resonator 100. The thickness of the electrical conductor 1044 may be about 1/10 of the wavelength associated with the target resonance frequency.

The composite member 104 may include an electrical insulator positioned between the electrical conductor 1044 and the piezoelectric layer 1043 (and directly contacting at least one of the electrical conductor 1044 and the piezoelectric layer 1043. A bottom area and/or a top area of the electrical insulator may be equal to a bottom area and/or a top area of the electrical conductor 1044 and/or a bottom area and/or a top area of the piezoelectric layer 1043. The electrical conductor 1044 may be positioned between the cavity 105 and the electrical insulator. The electrical insulator may be formed of one or more inorganic materials. The electrical insulator may be or may include at least one of a silicon oxide layer, a silicon nitride layer, and a silicon oxynitride layer. The electrical insulator may be or may include a silicon oxide layer. The composite member 104 may include an adhesive layer (or glue layer) positioned between the electrical conductor 1044 and the electrical insulator for reinforcing bonding between the electrical conductor 1044 and the electrical insulator. The adhesive layer may be formed of a material that has a wurtzite crystal structure. The adhesive layer may be formed of molybdenum (Mo).

The dielectric member 150 may include a dielectric layer 101 and a dielectric layer 102. The dielectric layer 102 may be positioned between the dielectric layer 101 and the composite member 104 and may be positioned between the dielectric layer 101 and the dielectric member 106. A height of the cavity 103 (e.g., a maximum height of the cavity 103 in a direction perpendicular to a bottom side of the piezoelectric layer 1043) may be equal to a thickness of the dielectric layer 102. The sealer 108 may be positioned between two portions of the dielectric layer 101. A length of the sealer 108 (in the direction perpendicular to the bottom side of the piezoelectric layer 1043) may be greater than or equal to a thickness of the dielectric layer 101 (e.g., a maximum height of the dielectric layer 101 in the direction perpendicular to the bottom side of the piezoelectric layer 1043). The length of the sealer 108 may be greater than the thickness of the dielectric layer 101, and the sealer 108 may extend into the cavity 103.

A material of the dielectric layer 101 may be different from or identical to a material of the dielectric layer 102. Each of the dielectric layer 101 and the dielectric layer 102 may be formed of one or more of a silicon oxide material, a silicon nitride material, silicon dioxide ($SiO_2$), fluorocarbon (CF), carbon-doped silicon oxide (SiOC), silicon nitride (SiN), and silicon carbonitride (SiCN). The dielectric layer 102 and/or the dielectric layer 101 may include a SiCN film formed on a CF film. The CF film may be formed of an amorphous (non-crystalline) CF material.

A material of the set of sealers that includes the sealer 108 may be different from or identical to a material of the dielectric layer 101 and/or a material of the dielectric layer 102. The sealer 108 may be formed of silicon dioxide ($SiO_2$).

A material of the dielectric member 106 may be different from or identical to a material of the dielectric layer 101 and/or a material of the dielectric layer 102. The dielectric member 106 may be formed of a silicon oxide material.

A material of the set of sealers that includes the sealer 107 may be different from or identical to a material of the dielectric member 106. The sealer 107 may be formed of silicon dioxide ($SiO_2$).

The resonator 100 may include a dielectric layer 109. The dielectric layer 101 may be positioned between the dielectric layer 109 and the dielectric layer 102. The sealer 108 may be positioned between the dielectric layer 109 and the cavity 103 and may directly contact the dielectric layer 109. A material of the dielectric layer 109 may be different from or identical to a material of the dielectric layer 101. The dielectric layer 109 may be formed of a low-k (i.e., low dielectric constant) dielectric material.

The resonator 100 may include further electrical conductors, such as electrical conductors 111, 112, 110, and 113. The electrical conductor 111 may be positioned on (and may directly contact) the dielectric member 106 and may be electrically connected through the electrical conductor 112 to the electrical conductor 1044. The electrical conductor 113 may be positioned on (and may directly contact) the dielectric member 109 and may be electrically connected through the electrical conductor 110 to the electrical conductor 111.

FIG. 2A, FIG. 2B, FIG. 2C, FIG. 2D, FIG. 2E, FIG. 2F, and FIG. 2G show schematic diagrams (e.g., schematic cross-sectional views) that illustrate elements and/or structures formed in a method for manufacturing the resonator 100 in accordance with one or more embodiments. FIG. 3 shows a flowchart that illustrates steps in a method for manufacturing the resonator 100 in accordance with one or more embodiments. Referring to FIG. 3, the method may include steps S301, S302, S303, S304, S305, S306, S307, S308, S309, and S310. The resonator 100 may have one or more features discussed with reference to FIG. 1.

Figure 2A:
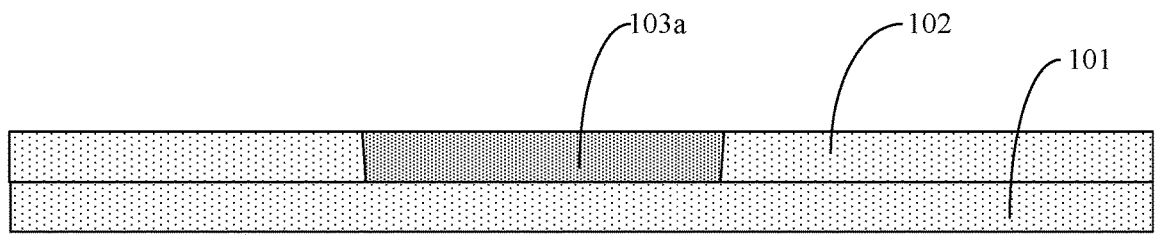
FIG. 2A, FIG. 2B, FIG. 2C, FIG. 2D, FIG. 2E, FIG. 2F, and FIG. 2G show schematic diagrams (e.g., schematic cross-sectional views) that illustrate elements and/or structures formed in a method for manufacturing a resonator in accordance with one or more embodiments.
Figure 3:
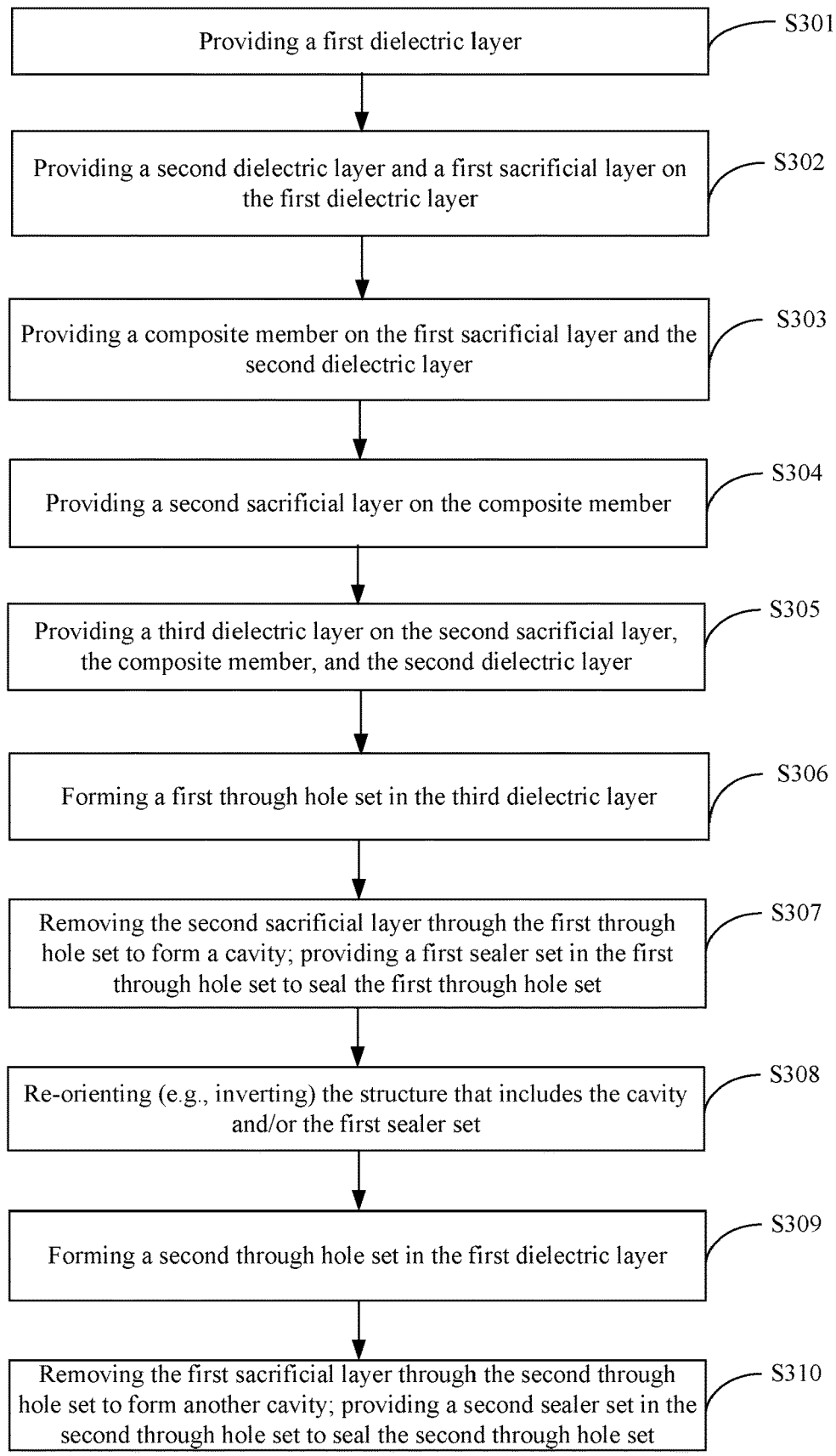
FIG. 3 shows a flowchart that illustrates steps in a method for manufacturing a resonator in accordance with one or more embodiments.

Referring to FIG. 3 and FIG. 2A, the step S301 may include providing a dielectric layer 101. The dielectric layer 101 may be formed on a substrate. The substrate may be formed of at least one of a semiconductor material, a silicon material, a ceramic material, a quartz material, a glass material, etc. The substrate may be removed in a subsequent process step. The dielectric layer 101 may be formed using one or more deposition processes, such as one or more of a chemical vapor deposition (CVD) process, a physical vapor deposition (PVD) process, a thermal chemical vapor deposition (thermal CVD) process, a high density plasma (HDP) process, etc. The method may include determining a thickness of the dielectric layer 101 based on one or more dimensions of the resonator 100. Suitable materials for the dielectric layer 101 are described above with reference to FIG. 1.

Referring to FIG. 3 and FIG. 2A, subsequent to the step S301, the step S302 may include providing a dielectric layer 102 and a sacrificial layer 103a on the dielectric layer 101. The step S302 may include the following steps: providing, e.g., through a CVD or PVD process, a sacrificial material layer on the dielectric layer 101; partially removing the sacrificial material layer, e.g., using a lithography process and/or an etching process, to form the sacrificial layer 103a; providing, e.g., through deposition, a dielectric material layer that covers the sacrificial layer 103a and the dielectric layer 101; partially removing the dielectric material layer to expose a side (e.g., top side) of the sacrificial layer 103a and to form the dielectric layer 102. The dielectric material layer may be partially removed using a planarization process, such as a chemical-mechanical planarization (CMP) process and/or an etching process. The planarization process may stop at the top side of the sacrificial layer 103a. Suitable materials for the dielectric layer 102 (i.e., suitable materials for the dielectric material layer) are described above with reference to FIG. 1.

The sacrificial layer 103a may have a substantially high etching selection ratio with respect to the dielectric layer 101, the dielectric layer 102, and the subsequently formed composite member 104. In an embodiment, the dielectric layers 101 and 102 may be formed of silicon oxide, and the sacrificial layer 103a may be formed of at least one of silicon nitride, silicon carbonitride, etc. The method may include determining dimensions of the sacrificial layer 103a based on predetermined dimensions of the subsequently formed cavity 103.

Figure 2B:
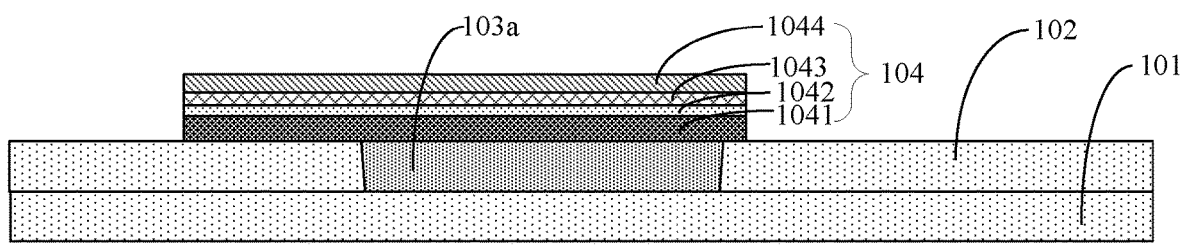

Referring to FIG. 3, FIG. 2A, and FIG. 2B, subsequent to the step S302, the step S303 may include providing a composite member 104 on both the sacrificial layer 103a and the dielectric layer 102. The composite member 104 may have elements, structures, and/or materials described above with reference to FIG. 1. The step S302 may include the following steps: providing material layers on both the sacrificial layer 103a and the dielectric layer 102; subsequently partially removing, e.g., through a lithography process and/or an etching process, the material layers to form the composite member 104.

The material layer for the piezoelectric layer 1043 may be formed using one or more of a vacuum evaporation deposition process, a sputtering process, a CVD process, a molecular beam epitaxy (MBE) process, etc. In an embodiment, the piezoelectric layer 1043 may be formed of AlN and may be formed using a reactive RF magnetron sputtering process: an aluminum metal set may be provided in a cathode in a process chamber, argon and nitrogen may be provided in the process chamber, and the reaction of the RF magnetron sputtering process may be performed at a temperature of about 200 degrees Celsius to form an AlN film.

One or more material layers for the electrical conductors, the electrical insulator(s), and/or the adhesive layer(s) in the composite member 104 may be formed using one or more deposition processes, such as one or more of a low pressure chemical vapor deposition (LPCVD) process, a plasma-assisted chemical vapor deposition (PECVD) process, a metal organic chemical vapor deposition (MOCVD) process, an atomic layer deposition (ALD) process, an ultra-high vacuum chemical vapor deposition (UHVCVD) process, a rapid thermal chemical vapor deposition (RTCVD) process, a molecular beam epitaxy (MBE) process, etc.

Figure 2C:
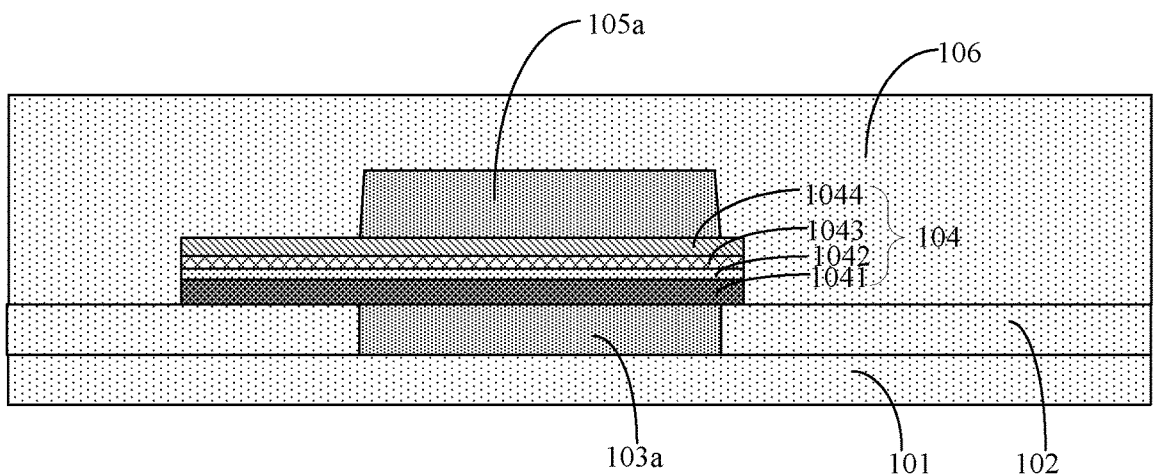

Referring to FIG. 3, FIG. 2B, and FIG. 2C, subsequent to the step S303, the step S304 may include providing a sacrificial layer 105a on the composite member 104. The step S304 may include the following steps: providing, e.g., using a CVD or PVD process, a sacrificial material layer on the composite member 104 (and the dielectric layer 102); partially removing the sacrificial material layer, e.g., using a lithography process and/or an etching process, to form the sacrificial layer 105a. The sacrificial layer 105a may be substantially aligned with the sacrificial layer 103a in a direction perpendicular to a side (e.g., bottom side or top side) of the composite member 104. Edges of the sacrificial layer 105a may be substantially aligned with edges of the sacrificial layer 103a in the direction perpendicular to the side (e.g., bottom side or top side) of the composite member 104.

The sacrificial layer 105a may have a substantially high etching selection ratio with respect to the composite member 104 and the subsequently formed the dielectric layer 106. In an embodiment, the dielectric layer 106 may be formed of silicon oxide, and the sacrificial layer 105a may be formed of at least one of silicon nitride, silicon carbonitride, etc. The method may include determining dimensions of the sacrificial layer 105a based on predetermined dimensions of the subsequently formed cavity 105.

Referring to FIG. 3, FIG. 2B, and FIG. 2C, subsequent to the step S304, the step S305 may include providing a dielectric layer 106 on the sacrificial layer 105a and the composite member 104. The dielectric layer 106 may directly contact one or more portions of the composite member 104 not covered by the sacrificial layer 105a and may directly contact one or more portions of the dielectric layer 102 not covered by the composite member 104. The dielectric layer 106 may be formed using one or more deposition processes, which may be analogous to one or more deposition processes used for forming the dielectric layer 101 and/or the dielectric layer 102.

Figure 2D:
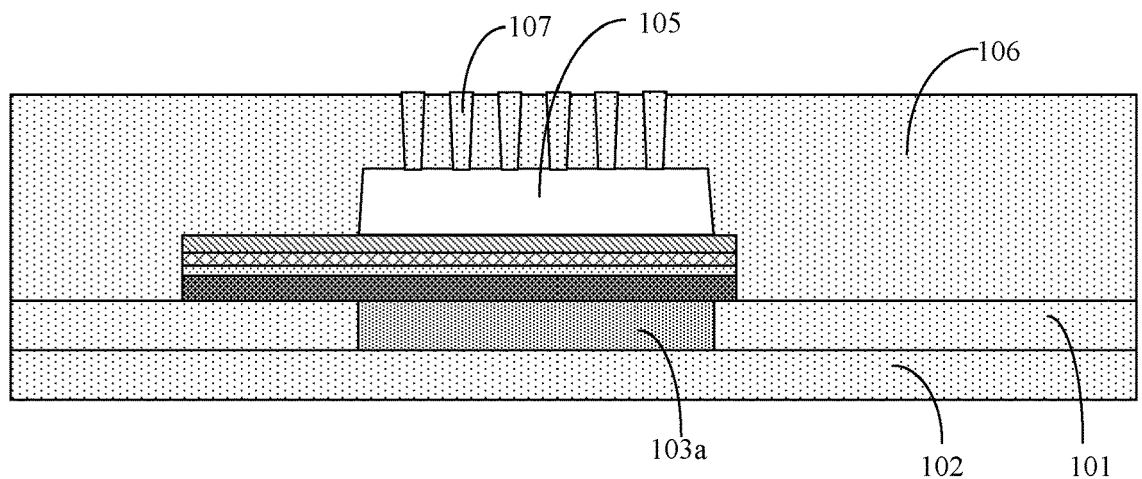

Referring to FIG. 3, FIG. 2C, and FIG. 2D, subsequent to the step S305, the step S306 may include forming a through hole set in the dielectric layer 106. The through hole set of the dielectric layer 106 may include one or more through holes, which may partially expose the sacrificial layer 105a. The step S306 may include the following steps: performing spin-coating, exposure, and development to form a patterned photoresist mask on the dielectric layer 106; partially removing, e.g., through an etching process, the dielectric layer 106 to form the through hole set of the dielectric layer 106. The etching process may include a dry etching process and/or a wet etching process. The dry etching process may include at least one of a reactive ion etching (RIE) process, an ion beam etching process, a plasma etching process, a laser cutting process, etc. The plasma etching process may utilize an etching gas that includes oxygen-based gases.

Referring to FIG. 3, FIG. 2C, and FIG. 2D, subsequent to the step S306, the step S307 may include the following steps: removing the sacrificial layer 105a through the through hole set of the dielectric layer 106 to form a cavity 105; subsequently providing a sealer set, which may include one or more sealers such a sealer 107, in the through hole set of the dielectric layer 106 to seal the through hole set of the dielectric layer 106. The sacrificial layer 105a may be removed using a wet etching process that has a substantially high etching selectivity ratio for the sacrificial layer 105a. In an embodiment, the sacrificial layer 105a may be formed of silicon nitride, and an etchant that includes hot phosphoric acid may be utilized in the wet etching process. The sealer set may be provided in the through hole set of the dielectric layer 106 using one or more deposition processes, such as a CVD process and/or a PVD process.

Figure 2E:
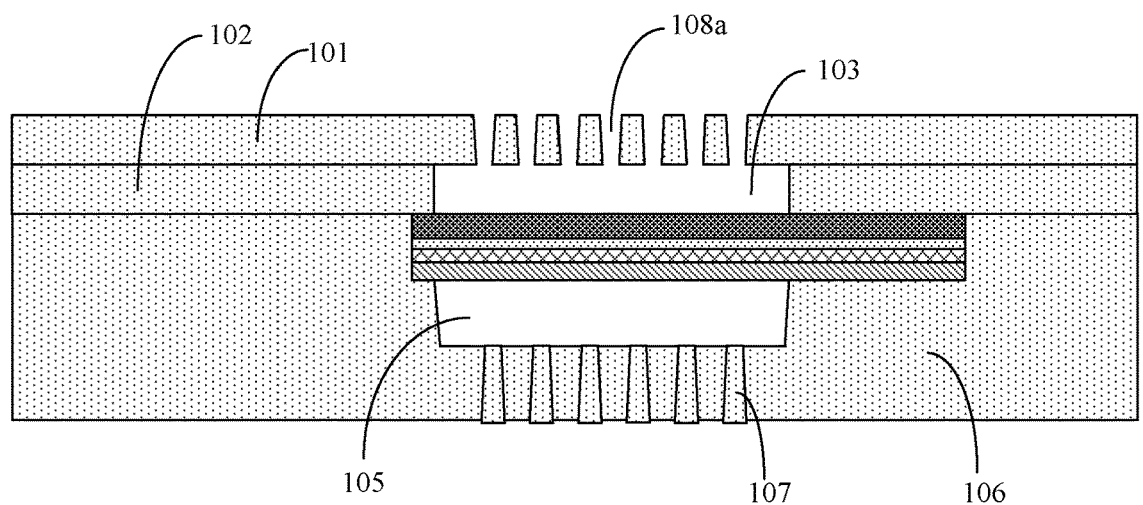

Referring to FIG. 3, FIG. 2D, and FIG. 2E, subsequent to the step S307, the step S308 may include reorienting (e.g., inverting) the structure illustrated in FIG. 2D for subsequent processing of the dielectric layer 101 and the sacrificial layer 103a. The structure may have the cavity 105 and/or the sealer 107. The structure may include the aforementioned substrate, which may be removed (e.g., using an etching process and/or CMP process) after the structure has been reoriented.

Referring to FIG. 3, FIG. 2D, and FIG. 2E, subsequent to the step S308, the step S309 may include forming a through hole set in the dielectric layer 101. The through hole set of the dielectric layer 101 may include one or more through holes such as a through hole 108a and may partially expose the sacrificial layer 103a. The step S309 may include the following steps: performing spin-coating, exposure, and development to form a patterned photoresist mask on the dielectric layer 101; partially removing, e.g., through an etching process, the dielectric layer 101 to form the through hole set of the dielectric layer 101. The etching process may include a dry etching process and/or a wet etching process. The dry etching process may include at least one of a reactive ion etching (RIE) process, an ion beam etching process, a plasma etching process, a laser cutting process, etc. The plasma etching process may utilize an etching gas that includes oxygen-based gases.

Referring to FIG. 3, FIG. 2D, FIG. 2E, and FIG. 2F, subsequent to the step S309, the step S310 may include removing the sacrificial layer 103a through the through hole set of the dielectric layer 101 to form a cavity 103; subsequently providing a sealer set, which may include one or more sealers such as a sealer 108, in the through hole set of the dielectric layer 101 to seal the through hole set of the dielectric layer 101. The sacrificial layer 103a may be removed (in the step S310) after the sacrificial layer 105a may have been removed (in the step S307). The sacrificial layer 103a may be removed using a wet etching process that has a substantially high etching selectivity ratio for the sacrificial layer 103a. In an embodiment, the sacrificial layer 103a may be formed of silicon nitride, and an etchant that includes hot phosphoric acid may be utilized in the wet etching process. The etch rates of the dielectric layer 102 and the composite member 104 may be substantially low and/or may approximate zero in the wet etching process. The sealer set may be provided in the through hole set of the dielectric layer 101 using one or more deposition processes, such as a CVD process and/or a PVD process.

Figure 2F:
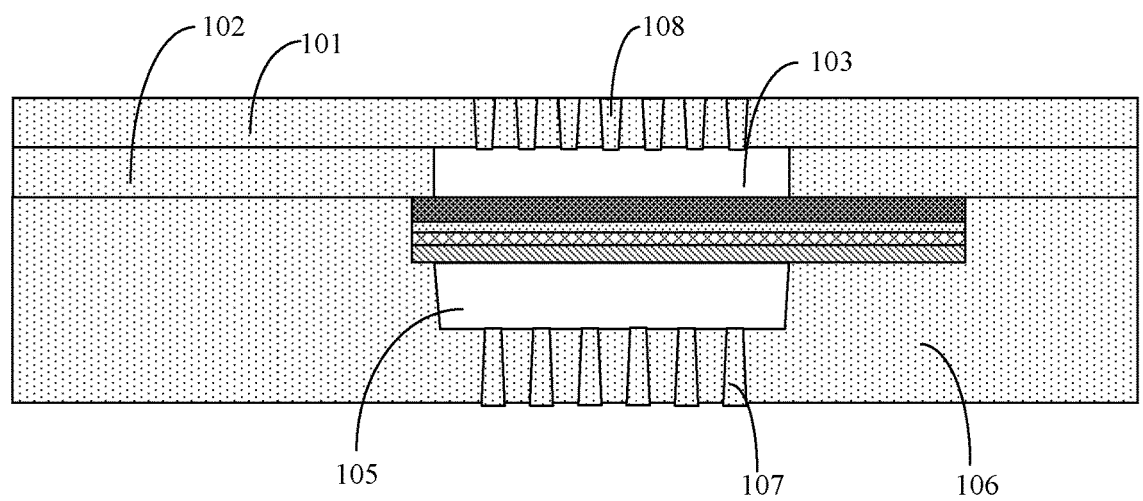
Figure 2G:
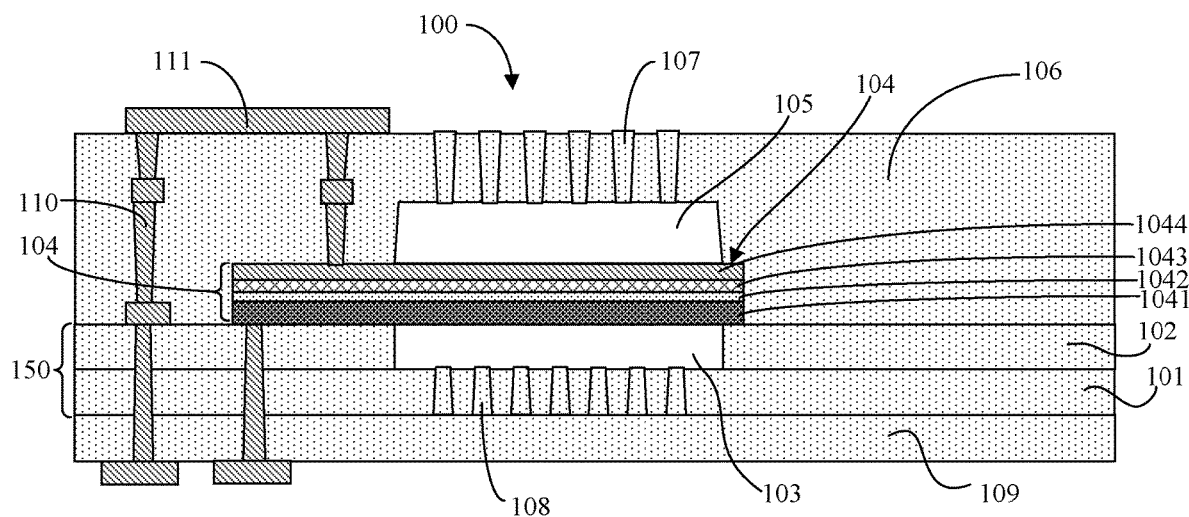

Referring to FIG. 2F and FIG. 2G, the method may include the following steps: providing a dielectric layer 109 on the dielectric layer 101; providing electrical conductors 111, 110, etc. that are electrically connected to the composite member 104; reorienting (e.g., inverting) the structure illustrated in FIG. 2F. The structure may have the cavity 103 (in addition to the cavity 105) and/or the sealer 108 (in addition to the sealer 107). The dielectric layer 101 (with the through hole set of the dielectric layer 101) and the dielectric layer 102 may form the dielectric member 105 of the resonator 100 discussed above with reference to FIG. 1. The dielectric layer 106 (with the through hole set of the dielectric layer 106) may be the dielectric member 106 of the resonator 100 discussed above with reference to FIG. 1.

Figure 4:
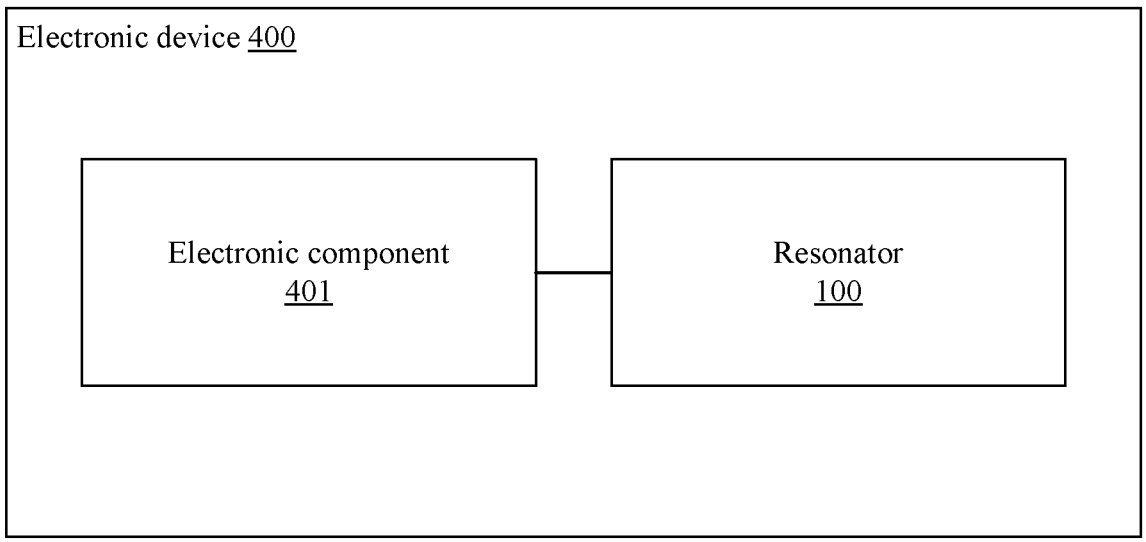
FIG. 4 shows a schematic block diagram that illustrates elements in an electronic device in accordance with one or more embodiments.

FIG. 4 shows a schematic block diagram that illustrates elements in an electronic device 400 in accordance with one or more embodiments. The electronic device 400 may include an electronic component 401 and the resonator 100, which may be electrically connected to the electronic component 401. The resonator 100 may have the above-discussed features.

In an embodiment, the electronic device 400 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 400 may be or may include an intermediate product (e.g., a radio frequency filter) or module including a resonator that has one or more of the features and advantages discussed above.

According to embodiments, in the resonator 100, the composite member 104 (which includes the piezoelectric layer 1043 without through holes or interruptions) may substantially (and/or completely) separate the two cavities 103 and 105 and may substantially (and/or completely) seal the two cavities 103 and 105. Advantageously, satisfactory performance of the resonator 100 (and the associated electronic device 400) may be attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A resonator comprising:
a first dielectric member, which has a first cavity;
a second dielectric member, which has a second cavity;
a composite member, which comprises a piezoelectric layer and is positioned between the first cavity and the second cavity;
a first sealer, which is positioned between two portions of the first dielectric member, wherein the first cavity is positioned between the first sealer and the composite member; and
a second sealer, which is positioned between two portions of the second dielectric member, wherein the second cavity is positioned between the second sealer and the composite member, wherein an end of the composite member extends into the second dielectric member and is electrically connected to an electrical conductor inside the second dielectric member and the second dielectric member is deposited on the first dielectric member.

2. The resonator of claim 1, wherein a section of the composite member extends from a first wall of the first cavity to a second wall of the first cavity and has no through holes.

3. The resonator of claim 1, wherein the first cavity exposes a side of the first sealer, and wherein the second cavity exposes a side of the second sealer.

4. The resonator of claim 1, wherein the first dielectric member comprises a first dielectric layer and a second dielectric layer, wherein the second dielectric layer is positioned between the first dielectric layer and the composite member, and wherein a height of the first cavity is equal to a thickness of the second dielectric layer.

5. The resonator of claim 4, wherein a material of the first dielectric layer is different from a material of the second dielectric layer.

6. The resonator of claim 4, wherein the first sealer is positioned between two portions of the first dielectric layer, and wherein a length of the first sealer is greater than or equal to a thickness of the first dielectric layer.

7. The resonator of claim 6, wherein the length of the first sealer is greater than the thickness of the first dielectric layer, and wherein the first sealer extends into the first cavity.

8. The resonator of claim 1, wherein the composite member comprises a first electrical conductor, which is positioned between the first cavity and the piezoelectric layer, wherein a section of the first electrical conductor extends from a first wall of the first cavity to a second wall of the first cavity and has no through holes.

9. The resonator of claim 8, wherein the first electrical conductor is formed of a semiconductor material.

10. The resonator of claim 8, wherein the composite member comprises a first electrical insulator, wherein the first electrical conductor is positioned between the first cavity and the first electrical insulator.

11. The resonator of claim 8, wherein the composite member comprises a second electrical conductor, which is positioned between the second cavity and the piezoelectric layer, wherein a section of the second electrical conductor continuously extends from a first wall of the second cavity to a second wall of the second cavity.

12. The resonator of claim 1, wherein a first side of the composite member overlaps and directly contacts the first dielectric member, wherein a first sidewall of the first cavity and a second sidewall of the first cavity are directly connected to the first side of the composite member, wherein a second side of the composite member overlaps and directly contacts the second dielectric member, and wherein a first sidewall of the second cavity and a second sidewall of the second cavity are directly connected to the second side of the composite member.

13. A method for manufacturing a resonator, the method comprising:
providing a first dielectric member, which has a first cavity;
providing a second dielectric member, which has a second cavity;
providing a composite member, which comprises a piezoelectric layer and is positioned between the first cavity and the second cavity;
providing a first sealer, which is positioned between two portions of the first dielectric member, wherein the first cavity is positioned between the first sealer and the composite member; and
providing a second sealer, which is positioned between two portions of the second dielectric member, wherein the second cavity is positioned between the second sealer and the composite member, wherein an end of the composite member extends into the second dielectric member and is electrically connected to an electrical conductor inside the second dielectric member and the second dielectric member is deposited on the first dielectric member.

14. The method of claim 13, further comprising:
providing a first dielectric layer;
providing a second dielectric layer and a first sacrificial layer on the first dielectric layer;
providing the composite member on the first sacrificial layer and the second dielectric layer;
forming a first through hole set in the first dielectric layer;
removing the first sacrificial layer through the first through hole set to form the first cavity; and
providing a first sealer set in the first through hole set to seal the first through hole set, wherein the first dielectric member comprises remaining portions of the first dielectric layer and the second dielectric layer, wherein the first sealer set includes a plurality of first sealers, the plurality of first sealers including the first sealer.

15. The method of claim 14, further comprising:
providing a second sacrificial layer on the composite member;
providing a third dielectric layer on the second sacrificial layer and the composite member;
forming a second through hole set in the third dielectric layer;
removing the second sacrificial layer through the second through hole set to form the second cavity; and
providing a second sealer set in the second through hole set to seal the second through hole set, wherein the second sealer set includes a plurality of second sealers, the plurality of second sealers including the second sealer.

16. The method of claim 15, wherein the first sacrificial layer is removed after the second sacrificial layer has been removed.

17. The method of claim 16, further comprising:
reorienting a structure that has the second cavity before forming the first through hole set.

18. The method of claim 13, further comprising:
reorienting a structure that has the second cavity before forming the first cavity.

19. The method of claim 13, wherein the composite member comprises a first electrical conductor, which is positioned between the first cavity and the piezoelectric layer, wherein a section of the first electrical conductor extends from a first wall of the first cavity to a second wall of the first cavity and has no through holes, and wherein the first cavity is aligned with the second cavity in a direction perpendicular to a side of the first electrical conductor that is exposed by the first cavity.

20. An electronic device comprising:
an electronic component; and
a resonator electrically connected to the electronic component and comprising:
a first dielectric member, which has a first cavity;
a second dielectric member, which has a second cavity;
a composite member, which comprises a piezoelectric layer and is positioned between the first cavity and the second cavity;
a first sealer, which is positioned between two portions of the first dielectric member, wherein the first cavity is positioned between the first sealer and the composite member; and
a second sealer, which is positioned between two portions of the second dielectric member, wherein the second cavity is positioned between the second sealer and the composite member, wherein an end of the composite member extends into the second dielectric member and is electrically connected to an electrical conductor inside the second dielectric member and the second dielectric member is deposited on the first dielectric member.

* * * * *